United States Patent [19]

Imai

[11] Patent Number: 4,984,256
[45] Date of Patent: Jan. 8, 1991

[54] CHARGE TRANSFER DEVICE WITH BOOSTER CIRCIUT

[75] Inventor: Shin-ichi Imai, Yokohama, Japan

[73] Assignee: Kabushiki Kaisha Toshiba, Kawasaki, Japan

[21] Appl. No.: 152,382

[22] Filed: Feb. 4, 1988

[30] Foreign Application Priority Data

Feb. 13, 1987 [JP] Japan ................ 62-30747

[51] Int. Cl.$^5$ ................ G11C 19/28; H01L 29/78
[52] U.S. Cl. ................ 377/60; 377/58; 377/62; 307/574; 307/578; 307/296.6; 357/24
[58] Field of Search ........... 377/60, 61, 57, 58, 377/59, 60, 63; 357/24; 307/571, 574, 575, 577, 578, 581, 582, 583, 304, 353, 352, 296 R, 297

[56] References Cited

U.S. PATENT DOCUMENTS

| | | |
|---|---|---|
| 3,955,101 | 5/1976 | Amelio et al. ............ 377/58 |
| 4,100,437 | 7/1978 | Hoff, Jr. ............ 323/314 |
| 4,180,807 | 12/1979 | Eichelberger et al. ............ 377/58 |
| 4,479,067 | 10/1984 | Fujita ............ 307/581 |
| 4,614,882 | 9/1986 | Parker et al. ............ 307/297 |
| 4,627,083 | 12/1986 | Pelgrom et al. ............ 377/60 |
| 4,633,101 | 12/1986 | Masuda et al. ............ 377/58 |
| 4,649,289 | 3/1987 | Nakano ............ 307/304 |
| 4,686,451 | 8/1987 | Li et al. ............ 307/297 |
| 4,709,168 | 11/1987 | Kamuro et al. ............ 307/443 |
| 4,719,372 | 1/1988 | Chappell et al. ............ 307/443 |
| 4,771,194 | 9/1988 | van Zeghbroeck ............ 307/443 |
| 4,809,307 | 2/1989 | Sakaue et al. ............ 377/60 |

OTHER PUBLICATIONS

Japanese Patent Disclosure (Kokai) No. 59-132668, Imai et al., Jul. 30, 1984.
Japanese Patent Disclosure (Kokai) No. 61-216473, Kimata, Sep. 26, 1986.

Primary Examiner—Stanley D. Miller
Assistant Examiner—Tai V. Duong
Attorney, Agent, or Firm—Finnegan, Henderson, Farabow, Garrett, and Dunner

[57] ABSTRACT

A floating diffusion region and a drain region are formed separately from each other in a substrate. A reset electrode is arranged above an area located between the drain region and the floating diffusion region. A voltage step-up circuit having a reference voltage generator receiving a power source voltage for generating a reference voltage and a step-up circuit receiving a clock pulse for applying a voltage level of the clock pulse to the reference voltage applies a voltage to the drain region. The gate of a conversion E type MOS transistor for converting and outputting the charge stored in the floating diffusion region to a signal having a voltage level proportional to the charge amount is connected to the floating diffusion region. The reference voltage generator has D type MOS transistor and E type MOS transistor connected in cascade for producing the reference voltage of the value corresponding to the variation from a process center of the manufacturing process of this charge transfer device. The D type MOS transsitor has the same conductivity type and construction as the MOS transistor formed of the reset electrode, the floating diffusion region and the drain region. The E type MOS transistor has the same conductivity type as the conversion E type MOS transistor.

7 Claims, 7 Drawing Sheets

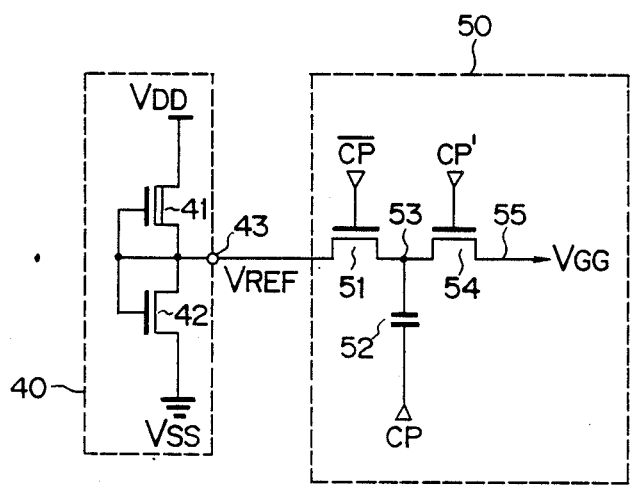
F I G. 5

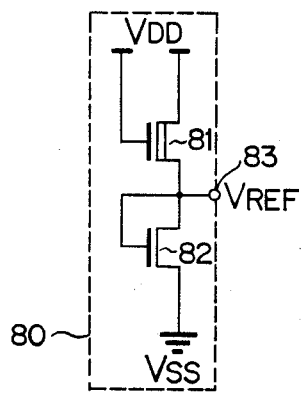
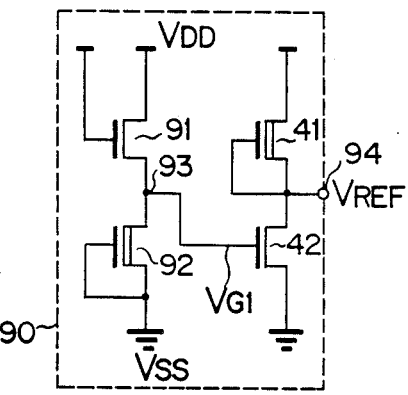
F I G. 8    F I G. 9
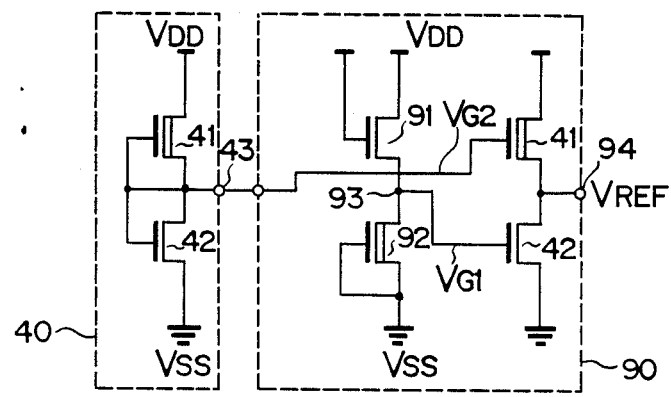
F I G. 10

CHARGE TRANSFER DEVICE WITH BOOSTER CIRCIUT

BACKGROUND OF THE INVENTION

The present invention relates to an output unit for a charge transfer device (hereinafter referred to as a "CTD") and, more particularly, to a reference voltage generator for a voltage step-up circuit for applying a stepped-up voltage to a drain.

CTDs are widely used in solid state image sensors, charge transfer type delay lines, comb line filters, transversal filters, and so forth. A floating diffusion system is a known type of semiconductor integrated CTD signal output system. One of a number of CTDs which employ a floating diffusion system with step-up circuit is disclosed in FIGS. 4 and 5 of Japanese Patent Disclosure No. Sho 59-132668, invented by the inventor of the present invention, Mr. Imai. The construction and the operation of the CTD with the step-up circuit will be described with reference to FIGS. 1 and 2.

An analog signal is input through terminal 1 to input unit 7 of CTD shown in FIGS. 1 and 2. Input unit converts the input signal to a signal charge with a charge amount corresponding to the level of the input signal, and also adds to this signal charge a predetermined DC bias charge. The resulting signal charge is then transferred toward floating diffusion region 9 by charge transfer unit 8. Charge transfer unit 8 comprises a front surface region of semiconductor substrate 5 and transfer electrodes 17$i$, 18$i$ (i is 1 to n). Transfer electrodes 17$i$, 18$i$ transfer the signal charges of semiconductor substrate 5 according to two clock pulses $\phi1$, $\phi2$. The transferred signal charges are fed under output gate electrode 1 to floating diffusion region 9. Reset voltage VGG, higher than power source voltage VDD, is applied by step-up circuit 19 to drain region 11. When reset pulse $\phi R$ applied to reset gate electrode 13 is low voltage VRL, potential value PRL under reset gate electrode 13 becomes a value for electrically interrupting drain region 1 and floating diffusion region 9 as shown in FIG. 3A. When reset pulse $\phi R$ becomes high voltage VRH, potential value PRH under reset gate electrode 13 becomes a value for conducting floating diffusion region 9 and drain region 11. The charge of floating diffusion region 9 is discharged (absorbed) under reset gate electrode 13 to drain region 11, and floating diffusion region 9 is reset to voltage VGG. When reset pulse $\phi R$ again becomes low voltage VRL, floating diffusion region 9 becomes a floating state to wait for the next charge input.

FET 14 of output circuit 16 is connected at its gate to floating diffusion region 9, and a constant current flows from current source 15 to a current path. FET 14 converts the signal charge fed to floating diffusion region 9 to voltage signal, and outputs voltage signal VOUT. The dynamic range of output signal VOUT is proportional to the difference (PD−PG)=DR between potential PD and potential PG under output gate electrode 10. Therefore, when applied voltage VB of output gate electrode 10 is set to the allowable value as low as possible with respect to potential PnL under transfer electrode 18n of the final stage, the dynamic range of the output signal of the CTD in FIGS. 1 and 2 becomes considerably larger than that of the output signal of the CTD applied with power source voltage VDD to drain region 11 since voltage VGG is higher than power source voltage VDD. The CTD can increase the charge containing capacity of floating diffusion region 9 without increasing the capacity of floating diffusion region 9.

When floating diffusion region 9 is reset, voltage VGG is also applied to the gate of FET 14. When the gate voltage of FET 14 at signal detecting time is denoted by VG, the voltage between the drain and the source is VDS, the voltage between the gate and the source is VGS, the threshold voltage of MOS transistor 14 is VTHE and the source voltage (the voltage of output terminal 2) is VO, the following equations (1) and (2) are satisfied.

$$VDS = VDD - VO \quad (1)$$

$$VGS - VTHE = VG - VO - VTHE \quad (2)$$

It is necessary to satisfy the following formula to saturate FET 14 at signal detection time.

$$VGS - VTHE < VDS \quad (3)$$

When the equations (1) and (2) are substituted for the formula (3), the following formula (4) is satisfied.

$$VG - VTHE < VDD \quad (4)$$

Therefore, when an output voltage having good linearity is required, it is necessary to determine the voltage relation so as to satisfy the above formula (4) at the signal detection time.

Then, step-up circuit 19 for applying voltage VGG higher than power source voltage VDD to drain region 11 will be described. FIG. 4 shows a step-up circuit disclosed in FIG. 7 of the Japanese Patent Disclosure. Step-up circuit 19 in FIG. 4 has reference voltage generator 20 including depletion type MOS transistors 21, 22; and step-up portion 30 including MOS transistor 31, MOS transistor 32 and capacitor 33. MOS transistors 21, 22 have the same conductivity type as that of MOS transistor (MOS transistor including regions 9, 11 and electrode 13) for forming reset means 12 of the CTD.

In FIG. 4, when clock pulse CP is a low level and clock pulse $\overline{CP}$ is a high level, MOS transistor 31 is turned on, MOS transistor 32 is turned off, capacitor 33 is charged, and the voltage across capacitor 33 becomes VREF (the output voltage of node 23). When clock pulse CP then becomes high level, MOS transistor 31 is turned off, second MOS transistor 32 is turned on, and the output voltage of node 34 is raised by "the peak value of clock pulse CP minus threshold value VTH of MOS transistor 32" higher than voltage VREF.

However, when reference voltage generator 20 in FIG. 4 is used as a reference voltage generator of drain step-up circuit 19 of the CTD, the following drawbacks occur. The higher output voltage VGG rises in the CT in FIGS. 1 and 2, the wider dynamic range DR shown in FIG. 3B becomes. When the potential of drain region 11 becomes higher than potential PRH under reset gate electrode 13 as a pulse of High level is applied to reset gate electrode 13, it is necessary to raise reset pulse $\phi R$. When bias voltage VFD of the signal at floating diffusion region 9 is set to as high as VDD+VTHE, transistor 14 of signal processor (output circuit) 16 enters nonsaturated state to lose the linearity of the output signal. Therefore, the upper limit of the step-up level coincides with the maximum value for maintaining the linearity indicated by formula (4). When formula (4) is transformed, the following formula (4') is obtained $$VG < VDD + VTHE \quad (4')$$

Since VG=VFD exists, the following formula (4") is satisfied $$VFD < VDD + VTHE \quad (4'')$$

When the capacity of floating diffusion region 9 is indicated by CFD and charge transferred to the floating diffusion region is indicated by Qs, the following equation (5) is satisfied.

$$VFD = VGG - (Qs/CFD) \quad (5)$$

Qs/CFD corresponds to the voltage component of the signal charge of floating diffusion region 9. Therefore, the following equation (6) is satisfied.

$$VGG - (Qs/CFD) = VFD < VDD + VTHE \quad (6)$$

The lower limit of voltage VGG must be larger than potential value PnL under the transfer electrode 18n. Therefore, the following equation (7) is satisfied.

$$|VTHD| < VGG - (Qs/CFD) = VFD < VDD + V\text{-}THE \quad (7)$$

The VTHD is the threshold value of the D-type MOS transistor formed of regions 9, 11 and electrode 13, and VTHD=PnL=approx. PG.

Threshold value VTHD of the depletion transistor and threshold value VTHE of the enhancement transistor are independently varied by process variations, e.g., the thickness of insulating film 6 in FIG. 2, the irregularity of ion density of ions to be implanted, the depth of the layer of implanted ions, and the irregular gate of the impurity density of the semiconductor substrate. However, since reference voltage generator 20 in FIG. 4 is composed of the same conductivity type MOS transistors, output voltage VGG is constant irrespective of the process variations. Thus, when |VTHD| is, for example, large, the tolerance of the lower limit of VFD is small from equation (7), and when VTHE is small, the tolerance of the upper limit of the VFD is small from equation (7).

In FIG. 3B, voltage VGG (which does not alter by the process variation) is applied to the drain region, potential PD is constant. When insulating film 6 is, for example, thickened, potential PG (=approx. PnL) is deepened, and dynamic range DR is reduced. Thus, the conventional art has such a disadvantage that CTD characteristic is altered due to the process variation.

SUMMARY OF THE INVENTION

Accordingly, an object of the present invention is to provide a charge transfer device with a voltage step-up circuit which does not reduce the margin of a range of a signal voltage of in a floating diffusion region due to a process variation and can provide good linearity and S/N at a predetermined power source voltage to produce an output signal of wide dynamic range.

Another object of the present invention is to provide an output unit for a charge transfer device with a voltage step-up circuit which can produce an output signal of a predetermined level with good linearity and S/N at a low power source voltage.

According to the present invention, there is provided a charge transfer device comprising:
- a charge transfer unit (8) receiving predetermined clock signals ($\phi 1$, $\phi 2$) for transferring a charge in a semiconductor substrate (5);
- a floating diffusion region (9) formed in the semiconductor substrate (5) for transferring a charge from the charge transfer unit (8);
- a drain region (11) formed separately from the floating diffusion region (9) in the semiconductor substrate (5);
- a reset electrode (13) formed over a region between the floating diffusion region (9) and the drain region (11) to receive a reset signal for controlling the conduction and nonconduction between the regions;
- voltage step-up circuit (19) having reference voltage generating circuit (40) receiving a predetermined voltage (VDD) for generating a reference voltage (VREF); and step-up circuit (32 to 34) receiving the reference voltage (VREF), adding a voltage to the reference voltage (VREF), and applying a voltage (VGG) raised to as high as the predetermined voltage (VDD) to the drain region (11);
- an output circuit (16) electrically connected to the floating diffusion region (9) for converting and outputting the charge stored in the floating diffusion region (9) to a signal having a voltage level substantially proportional to the charge amount;
- said reference voltage generator (4) comprising:
  - a depletion type MOS transistor of the same conductivity type and substantially the same construction as MOS transistor formed of the reset electrode (13), the floating diffusion region (9) and the drain region (11); and
  - an enhancement type MOS transistor connected in cascade fashion with the depletion type MOS transistor (41).

With the construction described above, in the output unit of the charge transfer device according to the present invention, the output voltage (VREF) of the reference voltage generator follows to the process variation. Therefore, the output (VGG) of the voltage step-up circuit 19 also follows the process variation. As understood from the equation (7), the dynamic range of the output signal of the charge transfer device can be maintained constant irrespective of a certain degree of process variation. The merits can be sufficiently provided by using the voltage step-up circuit to obtain a large dynamic range, good linearity and high S/N.

BRIEF DESCRIPTION OF THE DRAWINGS

FIGS. 5 and 6 are circuit diagrams of a voltage step-up circuit of a charge transfer device according to embodiments of the present invention;

FIGS. 8 to 10 are circuit diagrams showing another construction of a reference voltage generator used for the voltage step-up circuit.

DETAILED DESCRIPTION OF THE PREFERRED EMBODIMENTS

Figure 1:
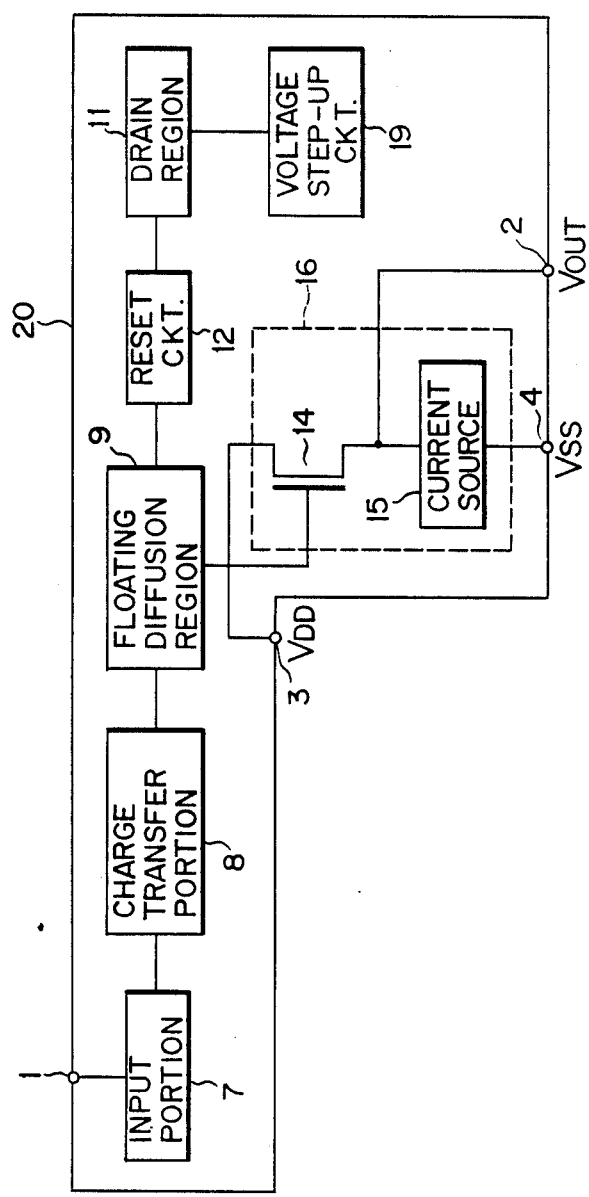
FIGS. 1 to 4 are views for describing a conventional charge transfer device.

The feature of the embodiment resides in that voltage VGG is varied in response to the degree of variation in threshold values VTHD, VTHE in the equation (7). To this end, the output voltage of the reference voltage source of the voltage step-up circuit depends upon the process variation. The voltage step-up circuit of embodiments of the present invention will be described with reference to FIGS. 1, 2 and 5.

FIG. 5 shows a voltage step-up circuit according to an embodiment of the present invention. The voltage step up circuit of FIG. 5 comprises reference voltage generator 40 and step-up portion 50. Reference voltage generator 40 comprises depletion type (D type) MOS transistor 41 connected at its drain to a VDD power source node, and connected at its source and gate to reference voltage output terminal 43; and enhancement type (E type) MOS transistor 42 connected at its source to VSS power source node and connected at its drain and gate to reference voltage output terminal 43. Step-up portion 50 comprises first E type MOS transistor 51 connected at one end of a current path to reference voltage output terminal 43 for applying clock pulse $\overline{CP}$ to its gate; capacitor 52 connected at its one end to the other end of the current path of first E type MOS transistor 51 for applying clock pulse CP to its other end; and second E type MOS transistor 54 connected at its one end of the current path to the connecting node 53 of first E type MOS transistor 51 and capacitor 52 for applying clock pulse CP' to its gate to generate output voltage VGG of a voltage step-up circuit 19 to other end 55 of the current path. Clock pulse CP' has the same phase as clock pulse CP, and has a high level which is higher by voltage level corresponding to threshold value VTHE of MOS transistor 54 than the high level of the clock pulse generated at node 53. D type MOS transistor 41 has the same conductivity type and the same construction as a MOS transistor (having regions 9, 11, and electrode 13 of FIG. 2) for forming CTD reset circuit (12 in FIG. 1). D type MOS transistor 41 is manufactured in the same process as a MOS transistor for forming reset circuit 12, and is saturated. E type MOS transistor 42 has the same conductivity type (N type in FIG. 2) as MOS transistor (14 in FIG. 2) connected at its gate to the floating diffusion region (9 in FIG. 2) of CTD, and is saturated.

Figure 2:
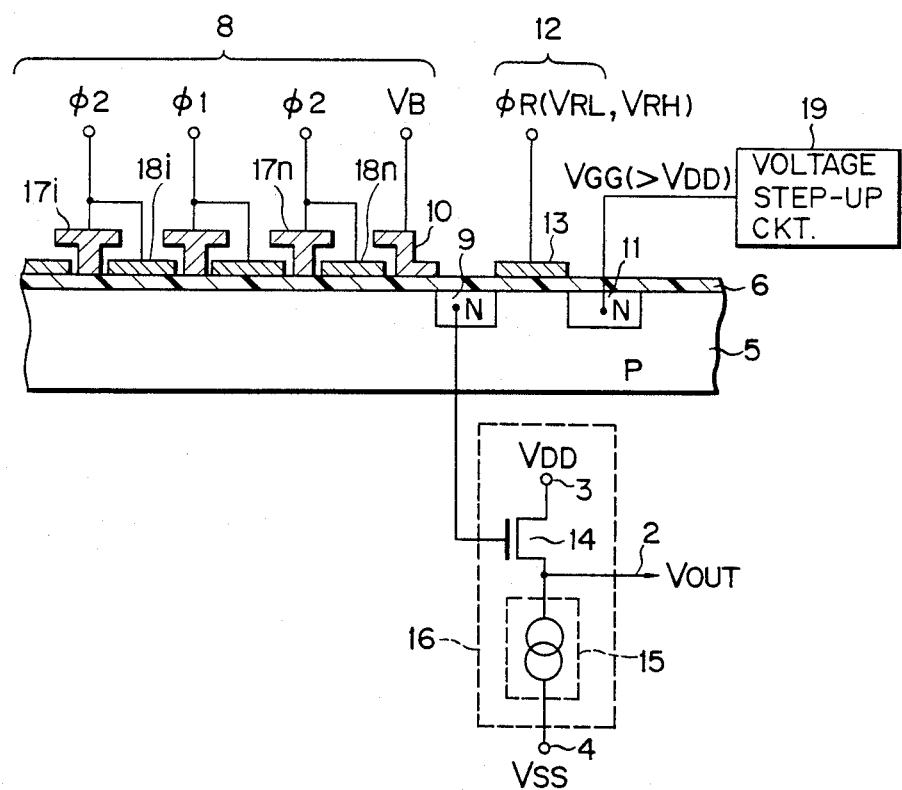
Figures 3A, 3B:
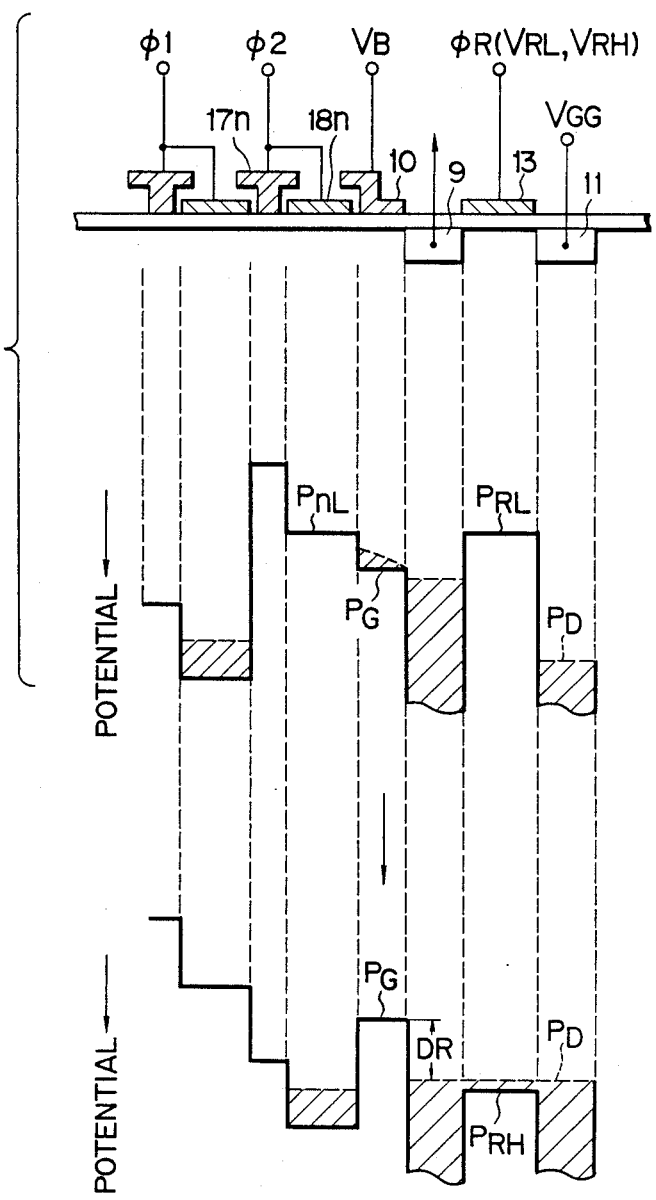

Then, the fact that output voltage VGG of voltage step-up circuit 19 of FIG. 2 varies in response to the process variation is observed. When reference voltage VREF of reference voltage generator 40 is first obtained, reference voltage VREF becomes as the following equation (8)

$$VREF = \frac{|VTHD| + \sqrt{\beta42/\beta41} \times VTHE}{\sqrt{\beta42/\beta41} + |KD|} \quad (8)$$

where $\beta41$: $\beta$ value of transistor 41 (current amplification factor)

VTHD: threshold value of transistor 41

$\beta42$: $\beta$ value of transistor 42

VTHE: threshold value of transistor 42

KD: value of back gate bias effect of transistor 41

KD = $\Delta$VTHD/$\Delta$VREF

In an ideal case in equation (8), VTHE = 1 V, VTHD = −6 V, |KD| = 0.2, $\sqrt{\beta42/\beta41}$ = 2.0 are set, VREF = 3.64 V is obtained.

Assume that it is varied in ranges of VTHE = 1±0.4 V, VTHD = −6±1 V due to the process variation.

(1) When both VTHE and |VTHD| are maximum, VTHE = 1.4 V, VTHD = −7 V, and VREF = 4.45 V are obtained.

(2) When both VTHE and |VTHD| are minimum, VTHE = 0.6 V, VTHD = −5 V, and VREF = 2.82 V are obtained.

Thus, reference voltage VREF becomes VTHE = 0.6 V, VTHD = −5 V and VREF = 2.82 V when (2) VTHE, |VTHD| of transistors 41, 42 are minimum due to process variation.

Thus, reference voltage VREF varies in response to the variation in the threshold voltages of transistors 41, 42 due to process variation.

The variation in reference voltage output (process dependency) reflects output voltage VGG of voltage step-up circuit 19. Thus, when |VTHD| is large and VTHE is also large in the above paragraph (1), VGG becomes high. Therefore, as understood from the equation (7), bias voltage VFD of signal in floating diffusion region 9 becomes high, and both upper and lower limits of the equation (7) are shifted to higher positions. Thus, the tolerance of the operating range of the signal charge is increased as compared with the case that reference voltage VREF is fixed. When VTHE is small and |VTHD| is small in the above paragraph (2), VGG becomes low. Therefore, as understood from the equation (7), bias voltage VFD of signal in floating diffusion region 9 becomes low, and both upper and lower limits of the equation (7) are shifted to lower positions. Thus, the tolerance of the operating range of the signal charge is increased as compared with reference voltage VREF is fixed. More specifically, output voltage VREF of reference voltage generator 40 is varied in response to process variation, with the result that output voltage VGG of voltage step-up circuit 19 is varied. Therefore, the advantages of using the voltage step-up circuit of the embodiment are sufficiently performed to increase the dynamic range of the output signal of CTD as compared with the case that reference voltage VREF is fixed.

The voltage step-up circuit of the invention is not limited to the construction in FIG. 5. For example, step-up portion 30 in FIG. 4 may be used instead of step-up portion 50 in FIG. 5. However, in this case, the output voltage of voltage step-up circuit 19 is reduced by the threshold voltage of MOS diode 32 as compared with output voltage VGG of the voltage step-up circuit of FIG. 5 by the operation of MOS diode 32. Therefore, it is necessary to set the reference voltage higher by threshold value VTHE (1 V in the above example) of MOS diode 32 in FIG. 4 than the reference voltage of FIG. 5 under process center conditions. Thus, values of MOS transistors 41, 42 are altered. Here, when VTHE = 1 V, VTHD = −6 V, |KD| = 0.2 V and $\sqrt{\beta42/\beta41}$ = 1.39 are set, VREF = 4.65 V from the equation (8), and the output voltage of step-up circuit becomes substantially equal to stepping-up output VGG of voltage step-up circuit in FIG. 5.

When (1) VTHE = 1.4 V and VTHD = 7 V are varied due to process variation, VREF = 5.63 V and VREF − VTHE = 4.23 V are obtained. (2) Similarly, when VTHE = 0.5 V and VTHD = −5 V are varied, VREF = 3.67 V and VREF − VTHE = 3.07 V are obtained. The process followability of reference voltage VREF—VTHE reflect stepping-up voltage VGG of this step-up circuit.

Figure 4:
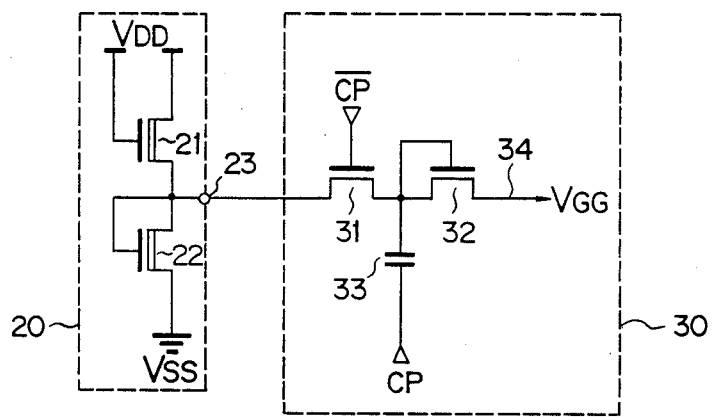

In FIGS. 4 and 5, MOS transistors 31, 51 may be replaced by depletion type MOS transistors or MOS diodes. Transistors 32, 54 may be replaced by depletion type MOS transistors. When the depletion type MOS transistors are used, it is necessary to apply a clock pulse of the voltage relation that the transistors are completely turned OFF when a low level clock is applied to the gates and transistors are completely turned ON when a high level clock is applied.

Figure 6:
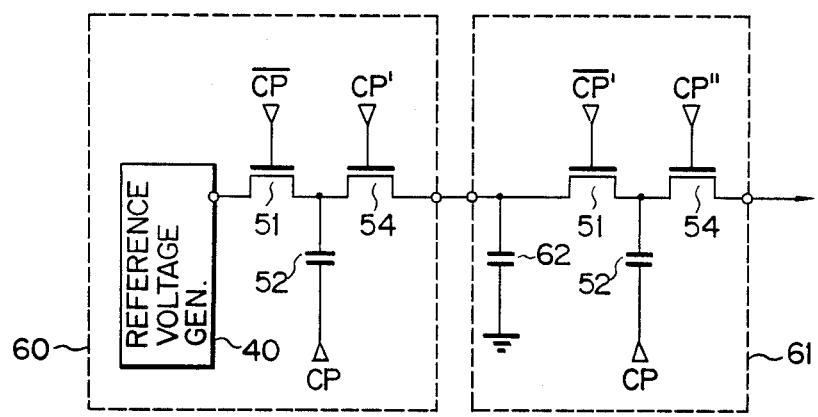
Figure 7:
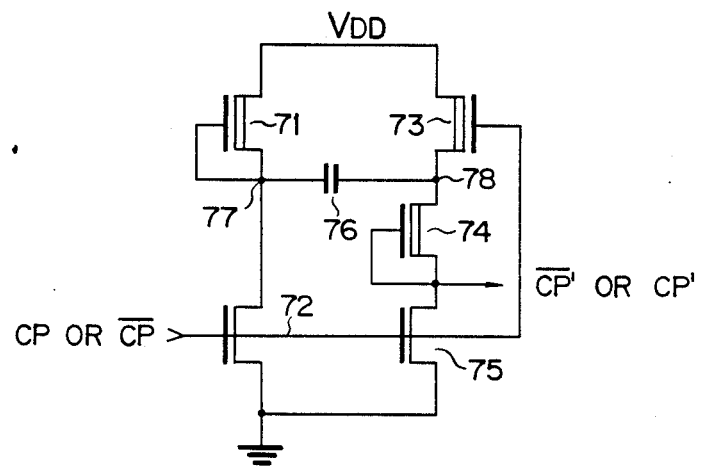
FIG. 7 is a circuit diagram showing an example of a circuit for supplying clock pulses stepped up to a higher voltage to the circuit of FIG. 6.

Further, a voltage step-up circuit in FIG. 6 may also be employed. In the voltage circuit in FIG. 6, the voltage step-up circuit in FIG. 5 is connected in a cascade, the input terminal of second stage voltage step-up circuit 61 is connected to the output terminal of the first stage voltage step-up circuit 60, and the reference voltage generator is replaced with a capacitor 62. In this circuit, normal clock pulses CP, $\overline{CP}$ and CP' (which has stepped-up high level) are supplied to the first stage voltage step-up circuit 60. In second stage voltage step-up circuit 61, clock pulse $\overline{CP'}$ and CP'' which have been stepped-up to a high level are applied. Clock pulses CP' and $\overline{CP'}$ are, for example, obtained by voltage step-up circuit 70 having transistors 71 to 75, and capacitor 76 in FIG. 7. In FIG. 7, when clock pulse CP or $\overline{CP}$ is high level, node 77 is low level, and transistors 73, 75 are turned ON. Capacitor 76 is charged, and voltage of one terminal 78 of capacitor 76 becomes VDD. At this time, $\overline{CP'}$ or CP' becomes low level (substantially ground level). When clock pulse CP or $\overline{CP}$ is low level, node 77 is high level, and transistors 73, 75 are turned OFF. The voltage of one terminal 78 of capacitor 76 becomes 2 VDD(VDD+VDD), and this voltage become $\overline{CP'}$ or CP'. Clock pulse CP'' varies from 0 V to 3 VDD at level synchronously with clock pulse CP and obtained by a circuit similar to FIG. 7.

The reference voltage generator is not limited to that in FIG. 5. Modified examples of the reference voltage generator are shown and described in FIGS. 8 to 10. Reference voltage generator 80 in FIG. 8 comprises a D type MOS transistor 81 connected at its drain and gate to the VDD power source node, and connected at a source to reference voltage output terminal 83 for operating in a nonsaturated state; and an E type MOS transistor 82 connected at its source to the VSS voltage source, and connected at its gate and source to reference voltage output terminal 83. Even when using reference voltage generator 80 of FIG. 8, reference voltage VREF follows the process variation in the same manner as the case that reference voltage generator 40 of FIG. 5 is used.

In FIG. 9, the drain and the gate of E type MOS transistor 91 are connected to VDD power source node, and the gate and the source of D type MOS transistor 92 are connected to VSS voltage source. The gate of E-type transistor 42 in reference voltage generator circuit 40 in FIG. 5 is switching connected from a reference voltage output terminal to junction 93 between transistors 91 and 92. Transistors 41 and 42 have their junction taken out as reference output voltage terminal 94.

Where E type MOS transistor 91 and D type MOS transistor 92 have greater VTHE and |VTHD| levels, respectively, the gate voltage VGI becomes small so that the mutual conductance gm of E type MOS transistor 42 is lowered by a greater extent of VTHE plus a smaller extent of VG1. Where, on the other hand, E type MOS transistor 91 and D type MOS transistor 92 have smaller VTHE and |VTHD| levels, respectively, the gate voltage VG1 becomes greater so that the trans-conductance gm of E type transistor 42 is increased by a smaller extent of VTHE plus a greater extent of VG1. As a result, reference voltage generator circuit 90 has a much better process tracing characteristic than that of reference voltage generator circuit 40. It is to be noted that the same effect is also obtained even if the gate of D type MOS transistor 41 in FIG. 9 is connected to VDD power source node instead.

FIG. 10 shows a reference voltage generator of such a type as used as reference voltage generator 40 in FIG. 5 and as reference voltage generator of FIG. 9. The gate of D type MOS transistor 41 in circuit 90 is switching connected from output terminal 94 to reference voltage output terminal 43. In FIG. 10, when |VTHD| of D type MOS transistor 41 and VTHE of E type MOS transistor 42 are large, gate voltage VG2 becomes large. Therefore, trans-conductance gm of D type MOS transistor 41 of reference voltage generator 90 is increased in the amount that |VTHD| is large and VG2 is large. When |VTHD| of D type MOS transistor 41 of circuit 40 is small and VTHE of E type MOS transistor 42 is small, gate voltage VG2 is reduced. Therefore, the trans-conductance gm of D type MOS transistor 41 of reference voltage generator 90 is reduced in the amount that |VTHD| is small and VG2 is small. Consequently, the process followability of reference voltage generator of FIG. 10 is further improved as compared with that of reference voltage generator of FIG. 9. Reference voltage generator 80 of FIG. 8 or reference voltage generator 90 of FIG. 9 may be used instead of circuit 40. In the reference voltage generator of FIG. 10, a plurality of circuits 90 are provided and may be connected in cascade so that the output voltages of the front stage circuits are connected to the input of the rear stage circuits.

It is desired to construct a D type MOS transistor for forming the reference voltage generator of the same process as the transistor for forming a reset circuit 12 to perform the process followability of the reference voltage generator. Similarly, in FIGS. 9 and 10, it is desired that D type MOS transistors are manufactured in the same process and E type MOS transistors are manufactured in the same process, because the process variation affects the transistors in an equal ratio.

An embodiment of the manufacturing steps will be described, for example, with transistors for forming reset circuit 12 and D type transistor 41 for forming the voltage step-up circuit with reference to FIGS. 11A to 11E.

Figure 11A:
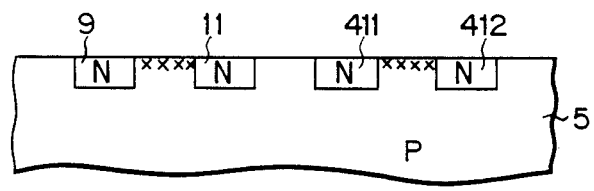
FIGS. 11A to 11E show manufacturing steps of a charge transfer device according to an embodiment of the present invention.
Figure 11B:
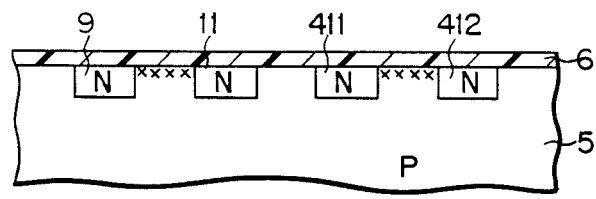
Figure 11C:
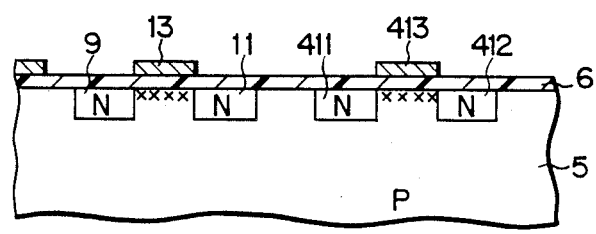
Figure 11D:
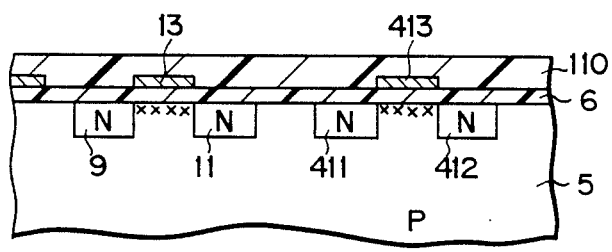

As shown in FIG. 11A, floating diffusion region 9, drain region 11, and source region 411 and drain region 412 of transistor 41 are formed by thermal diffusion in semiconductor substrate 5. Impurity ions X are implanted under the same conditions to a region between regions 9 and 11 and channel region between source region 411 and drain region 412. As shown in FIG. 11B, insulating film 6 is formed on semiconductor substrate 5. Polysilicon layer (so-called first polysilicon layer) is formed on insulating film 6. First polysilicon layer is patterned, and as shown in FIG. 11C, reset electrode 13 and gate electrode 413 of transistor 41 are formed together with transfer electrode 18i. As shown in FIG. 11D, insulating layer 110 is formed. An opening for forming electrode 17i is formed on insulating layer 110.

Figure 11E:
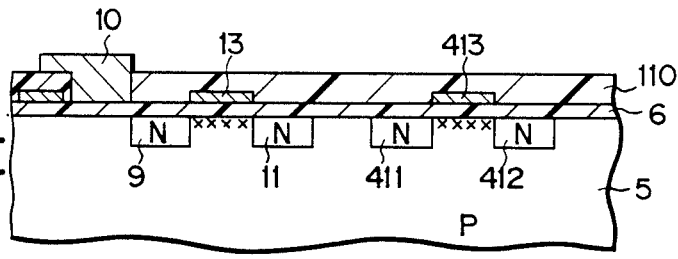

Polysilicon layer (so-called second polysilicon layer) is formed on insulating layer 110, and patterned to form transfer electrode 17i, and output gate electrode 10 as shown in FIG. 11E. Thus, D type MOS transistor 41 and MOS transistor for forming reset circuit 12 are formed in the same steps and have the same constitution. Therefore, the variations in the thicknesses of the insulating films electrode forming conditions, variations in the impurity densities in substrates, channel regions, semiconductor layers equally affect both the transistors to complete the process followability. In other words, when the transistors are formed as described above, the ratio of displacement from the process center of the process in a certain pellet equally affect the elements on the wafer, thereby accomplishing the desired effects. However, the above manufacturing steps are by way of example only, and the manufacturing steps are not limited to the embodiment.

According to the output unit of the charge transfer device, the voltage step-up circuit is provided. Therefore, the output signal of large level having good linearity and high S/N can be obtained under predetermined power source voltage. Or, the power source voltage necessary to obtain the output signal of a predetermined level having good linearity and high S/N can be reduced. Further, according to the present invention, the reference voltage generator of the voltage step-up circuit is deviced to provide process followability at the reference voltage output. Therefore, the output voltage of the voltage step-up circuit has the process followability. As a result, even if certain process variation occurs, the dynamic range of the output signal of CTD is widely maintained to obtain the output signal having good linearity and high S/N In the embodiments described above, the circuit formed of N-channel MOS transistors has been described as an example. However, the present invention is not limited to the particular embodiments, but can be similarly applied to the case that P-channel MOS transistors or complementary MOS transistors are employed in the circuit.

What is claimed is:
1. A charge transfer device comprising:
a first conductivity type semiconductor substrate;
a second conductivity type floating diffusion region formed in said semiconductor substrate;
a second conductivity type drain region formed separately from the floating diffusion region in the semiconductor substrate;
at least one insulating film formed on the semiconductor substrate;
transfer electrodes formed on the insulating film, receiving predetermined clock signals to transfer a charge, within the semiconductor substrate, toward the floating diffusion region;
a reset electrode formed on the insulation film and above a region lying between the floating diffusion region and the drain region to form a MOS transistor, to receive a reset signal for controlling the conduction and nonconduction between the floating diffusion regions and the drain region;
a voltage step-up circuit having a reference voltage generator for generating a reference voltage, and step-up means receiving the reference voltage and at least one clock pulse for sampling the reference voltage and for applying the voltage of the clock pulse to the sampled reference voltage, to apply a voltage having a level, higher than the reference voltage, to the drain region;
an output circuit having an enhancement type MOS transistor electrically connected at its gate to the floating diffusion region, and a constant current source for supplying a predetermined current to the current path of the enhancement type MOS transistor, for converting the charge stored in the floating diffusion region to a signal having a voltage substantially proportional to a charge amount of the charge; and
said reference voltage generator comprising,
a first depletion type MOS transistor having second conductivity type source and drain regions formed in the semiconductor substrate in the same steps as the formation of the floating diffusion region and the drain region, and being of the same conductivity type and construction as the MOS translator formed by the reset electrode, the floating diffusion region and the drain region, the insulating film, a gate electrode formed on the insulating film in the same steps as the formation of the reset electrode, and receiving a first voltage at one end of a current path thereof; and
a first enhancement type MOS transistor connected at one end of the current path in cascade with the other end of the current path of the first depletion type MOS transistor, being of the same conductivity type as the enhancement type MOS transistor of said output circuit, for receiving the second voltage at the other end of the current path thereof, and for generating the reference voltage at the one end of the current path.

2. A charge transfer device according to claim 1, wherein said first voltage is a power source voltage, a gate of the first depletion type MOS transistor is connected to one of the power source voltage and the other end of the current path of the first depletion type MOS transistor, and
the second voltage is a ground voltage, and a gate of the first enhancement type MOS transistor is connected to one end of the current path of the first enhancement type MOS transistor.

3. A charge transfer device according to claim 1, wherein
the first voltage is a power source voltage, a gate of the first depletion type MOS transistor is connected to one of the power source voltage and the other end of the current path of the first depletion type MOS transistor,
the second voltage is a ground voltage which is applied to one end of the current path of the first enhancement type MOS transistor, the other end of the current path of the first enhancement type MOS transistor is connected to the other end of the current path of the first depletion type MOS transistor,
the reference voltage generator further comprising a second enhancement type MOS transistor and second depletion type MOS transistor, wherein
the power source voltage is applied to one end of the current path and the gate of the second enhancement type MOS transistor,
the ground voltage is applied to one end of a current path and a gate of the second depletion type MOS transistor, the other end of the current path of the second depletion type MOS transistor is connected to the other end of the current path of the second enhancement type MOS transistor, a gate of the first enhancement type MOS transistor is connected to the connecting point of the second depletion type MOS transistor and the second enhancement type MOS transistor, and the voltage of the connecting point of the first depletion type MOS transistor and the first enhancement type MOS transistor is output as the reference voltage.

4. A charge transfer device according to claim 1, wherein the first voltage is a power source voltage, and the second voltage is a ground voltage, the reference voltage generator further including second and third enhancement type MOS transistors and second and third depletion type MOS transistors, wherein the power source voltage is applied to one end of a current path and a gate of the second enhancement type MOS transistor, the ground voltage is applied to one end of a current path and a gate of the second depletion type MOS transistor, the other end of the current path of the second depletion type MOS transistor is connected to the other end of the current path of the second enhancement type MOS transistor, the power source voltage is applied to one end of a current path of the third depletion type MOS transistor, the ground voltage is applied to one end of a current path of the third enhancement type MOS transistor, the other end of the current path of the third enhancement type MOS transistor is connected to the other end of the current path of the third depletion type MOS transistor, a gate of the third depletion type MOS transistor is connected to a connecting point of the first depletion type MOS transistor and the first enhancement type MOS transistor, a gate of the third enhancement type MOS transistor is connected to a connecting point of the second depletion type MOS transistor and the second enhancement type MOS transistor, and the voltage of the connecting point of the third depletion type MOS transistor and the third enhancement type MOS transistor is output as the reference voltage.

5. A charge transfer device comprising:

a charge transfer unit receiving at least one clock signal for transferring a charge within a semiconductor substrate;

a floating diffusion region formed on the semiconductor substrate, for transferring a charge from the charge transfer unit;

a drain region formed separately from the floating diffusion region in the semiconductor substrate;

a reset electrode formed above a region located between the floating diffusion region and the drain region to form a MOS transistor, to receive a reset signal and to control the conduction and nonconduction between the floating diffusion region and the drain region;

a voltage step-up circuit having a reference voltage generator receiving a predetermined voltage from a power supply, for generating a reference voltage, and step-up means receiving the reference voltage, adding a voltage thereto and applying a resultant voltage to the drain region;

an output circuit electrically connected to the floating diffusion region, for converting and outputting a charge stored in the floating diffusion region to a signal having a voltage level substantially proportional to the amount of charge;

said reference voltage generator comprising a first depletion type MOS transistor having the same conductivity type and the same construction as the MOS transistor comprised by said reset electrode, said floating diffusion region, and said drain region; and a first enhancement type MOS transistor connected in cascade fashion to the first depletion type MOS transistor;

wherein a power source voltage is applied to one end of a current path of said first depletion type MOS transistor, and the other end of the current path and a gate of the first depletion type MOS transistor is connected to a reference voltage output terminal, a ground voltage is applied to one end of a current path of the first enhancement type MOS transistor, and the other end of the current path of the first enhancement type MOS transistor is connected to the reference voltage output terminal, said charge transfer device further comprising a second depletion type MOS transfer and a second enhancement type MOS transistor, connected such that the power source voltage is applied to one end of a current path and a gate of the second enhancement type MOS transistor, and the other end of the current path of the second enhancement type MOS transistor is connected to the gate of said first enhancement type MOS transistor, and a ground voltage is applied to one end of a current path and a gate of the second depletion type MOS transistor, the other end of the current path of the second enhancement type MOS transistor is connected to the gate of the first enhancement type MOS transistor.

6. A charge transfer device according to claim 5, further comprising a third depletion type MOS transistor and a third enhancement type MOS transistor, wherein the power source voltage is applied to one end of a current path of the third depletion type MOS transistor, and the ground voltage is connected to one end of the current path of the third enhancement type MOS transistor, and the gates and the other ends of the current paths of both the third enhancement type and depletion type MOS transistors are connected to the gate of the first depletion type MOS transistor.

7. A charge transfer device, comprising:

a charge transfer unit receiving at least one clock signal for transferring a charge within a semiconductor substrate;

a floating diffusion region formed on the semiconductor substrate, for transferring a charge from the charge transfer unit;

a drain region formed separately from the floating diffusion region in the semiconductor substrate;

a reset electrode formed above a region located between the floating diffusion region and the drain region to form a MOS transistor, to receive a reset signal and to control the conduction and nonconduction between the floating diffusion region and the drain region;

a voltage step-up circuit having a reference voltage generator receiving a predetermined voltage from a power supply, for generating a reference voltage, and step-up means receiving the reference voltage, adding a voltage thereto and applying a resultant voltage to the drain region;

an output circuit electrically connected to the floating diffusion region, for converting and outputting a charge stored in the floating diffusion region to a signal having a voltage level substantially proportional to the amount of charge;

said reference voltage generator comprising a first depletion type MOS transistor having the same conductivity type and the same construction as the MOS transistor comprised by said reset electrode, said floating diffusion region and said drain region; and a first enhancement type MOS transistor connected in cascade fashion to the first depletion type MOS transistor;

wherein said step-up means comprises:
 a MOS transistor whose gate receives a first pulse and whose current path is connected at one end to an output terminal of the reference voltage generator and is connected at the other end to a first node,
 a capacitor connected at one end to the first node and receiving a second pulse at the other end; and
a MOS transistor having a gate receiving a third pulse having a high level higher than a high level of the second pulse is the same phase as the second pulse and being connected to the first node at one end of its current path and generating an output voltage at the other end of its current path.

* * * * *